(12) United States Patent
Izbinski et al.

(10) Patent No.: US 10,282,495 B2
(45) Date of Patent: May 7, 2019

(54) METHODS OF EVALUATING PERFORMANCE OF CUTTING ELEMENTS FOR EARTH-BORING TOOLS

(71) Applicant: Baker Hughes Incorporated, Houston, TX (US)

(72) Inventors: Konrad T. Izbinski, The Woodlands, TX (US); Aaron J. Dick, Houston, TX (US); Nicholas J. Lyons, Sugar Land, TX (US); Alejandro Flores, Spring, TX (US); Suresh G. Patel, The Woodlands, TX (US); Jarod DeGeorge, Spring, TX (US)

(73) Assignee: Baker Hughes Incorporated, Houston, TX (US)

( * ) Notice: Subject to any disclaimer, the term of this patent is extended or adjusted under 35 U.S.C. 154(b) by 520 days.

(21) Appl. No.: 14/810,053

(22) Filed: Jul. 27, 2015

(65) Prior Publication Data
US 2017/0032061 A1   Feb. 2, 2017

(51) Int. Cl.
*G06F 17/50* (2006.01)
*E21B 10/00* (2006.01)

(52) U.S. Cl.
CPC .......... *G06F 17/5009* (2013.01); *E21B 10/00* (2013.01)

(58) Field of Classification Search
CPC .............................. G06F 17/5009; E21B 10/00
See application file for complete search history.

(56) References Cited

U.S. PATENT DOCUMENTS

| | | | |
|---|---|---|---|
| 6,804,635 B1 | 10/2004 | Dhondt | |
| 6,856,949 B2* | 2/2005 | Singh | E21B 10/16 175/39 |
| 7,286,959 B2 | 10/2007 | Steinke | |
| 8,195,438 B2 | 6/2012 | Singh et al. | |
| 8,760,668 B1* | 6/2014 | Wiggins | G01N 11/00 356/627 |
| 2005/0038631 A1* | 2/2005 | Steinke | E21B 10/00 702/182 |
| 2005/0133260 A1* | 6/2005 | Singh | E21B 10/08 175/39 |

(Continued)

OTHER PUBLICATIONS

Kolandoozan et al, Finite element investigation and optimization of tool wear in drilling process of difficult-to-cut nickel-based superalloy using response surface methodology, Int. J. Advance design and manufacturing technology, vol. 7/ No. 2/ Jun. 2014. p. 67-76.*

(Continued)

*Primary Examiner* — Aniss Chad
*Assistant Examiner* — Chuen-Meei Gan
(74) *Attorney, Agent, or Firm* — TraskBritt

(57) ABSTRACT

Methods of evaluating prototype cutting elements for earth-boring tools may involve generating first and second sets of virtual representations of cutting elements from first and second sets of used cutting elements. First and second sets of measures of damage corresponding to damage for each of the first and second sets set of virtual representations of cutting elements may be determined. A best-performing set of cutting elements from the first and second sets of used cutting elements according to the first and second sets of measures of damage may be identified by performing a statistical analysis.

20 Claims, 6 Drawing Sheets

(56) References Cited

U.S. PATENT DOCUMENTS

| | | | | |
|---|---|---|---|---|
| 2005/0154568 A1* | 7/2005 | Huang | ............... | E21B 10/16 |
| | | | | 703/7 |
| 2007/0106487 A1* | 5/2007 | Gavia | ............... | E21B 10/00 |
| | | | | 703/7 |
| 2009/0166091 A1* | 7/2009 | Matthews | ........... | E21B 10/08 |
| | | | | 175/195 |
| 2010/0211362 A1* | 8/2010 | Huang | ............... | E21B 10/00 |
| | | | | 703/1 |
| 2010/0276209 A1* | 11/2010 | Yong | ................. | C22C 29/02 |
| | | | | 175/374 |
| 2013/0035902 A1* | 2/2013 | Endres | ............. | E21B 10/00 |
| | | | | 703/1 |
| 2014/0110181 A1* | 4/2014 | Zhang | ............... | E21B 10/55 |
| | | | | 175/428 |
| 2014/0250973 A1 | 9/2014 | Gledhill et al. | | |

OTHER PUBLICATIONS

Grathio Lab, How to: Mark yours tools, http://grathio.com/2012/01/mark-your-tools/, Jan 4, 2012. p. 1-6.*

D. Samuel Raj & L. Karunamoorthy (2016) Study of the Effect of Tool Wear on Hole Quality in Drilling CFRP to Select a Suitable Drill for Multi-Criteria Hole Quality, Materials and Manufacturing Processes, 31:5, 587-592, DOI: 10.1080/10426914.2015.1004713.*

Schmitt et al, Machine vision system for inspection flank wear on cutting tools, ACEEE Int. J. on Control System and Instrumentation vol. 03 No. 01 Feb. 2012 p. 27-31 (Year: 2012).*

Shahabi et al, Assessment of flank wear and nose radius wear from workpiece roughness profile in turning operation using machine vision, Int. J. Manuf. Technol (2009) 43: p. 11-21 (Year: 2009).*

* cited by examiner

METHODS OF EVALUATING PERFORMANCE OF CUTTING ELEMENTS FOR EARTH-BORING TOOLS

FIELD

This disclosure relates generally to methods of evaluating cutting elements for earth-boring tools. More specifically, disclosed embodiments relate to methods of evaluating cutting elements for earth-boring tools involving rigorous analysis of damage resistance of actual, used cutting elements associated with one metric to be evaluated relative to damage resistance of actual, used cutting elements associated with another metric to be evaluated.

BACKGROUND

When testing performance of cutting elements, such as prototype cutting elements, for earth-boring tools, it is conventional to construct a so-called "mixed-cutter" tool. For example, both prototype cutting elements and cutting elements of a preexisting design, such as those most-frequently deployed in the field, may be attached to the mixed-cutter tool. The mixed-cutter tool may then be used to drill a test bore into an earth formation. When the test bore is complete, the mixed-cutter tool may be retrieved, and the damage resistance of the prototype cutting elements may be assessed.

Assessment of the damage resistance of the prototype cutting elements may involve visually inspecting damaged portions of the prototype cutting elements, comparing the damaged portions of the prototype cutting elements to damaged portions of the cutting elements of the preexisting design, and making a qualitative judgment call about whether the prototype cutting elements exhibit more damage resistance than the cutting elements of the preexisting design. For example, an evaluator may make an overall judgment call whether the prototype cutting elements outperformed the cutting elements of the preexisting design based on his or her visual impression of the various damage types (e.g., abrasive wear, chipping, spalling, cracking) present on the cutting elements and based on whether replacement of some or all of the cutting elements of a certain type is necessary. Based on those judgment calls, the evaluator may then conclude whether the prototype cutting element exhibits improved damage resistance relative to the cutting element of the preexisting design.

Other methods of evaluating the performance of a prototype cutting element may involve simulating a drilling run and analyzing the simulated performance of the prototype cutting element.

BRIEF SUMMARY

In some embodiments, methods of evaluating sets of cutting elements for earth-boring tools may involve: having a borehole drilled by a mixed-cutter earth-boring tool comprising a first set of cutting elements and a second set of cutting elements secured to the mixed-cutter earth-boring tool; generating a first set of virtual representations of at least portions of the cutting elements from the first set of used cutting elements; generating a second set of virtual representations of at least portions of the cutting elements from the second set of used cutting elements; determining a first set of measures of damage corresponding to damage for each of the first set of virtual representations of the at least portions of the cutting elements; determining a second set of measures of damage corresponding to damage for each of the second set of virtual representations of the at least portions of the cutting elements; and identifying a best-performing set of cutting elements from the first and second sets of used cutting elements according to the first and second sets of measures of damage.

In other embodiments, methods of determining whether prototype cutting elements for earth-boring tools perform better than cutting elements of a preexisting design for the earth-boring tools may involve receiving a first set of virtual representations of at least damaged portions of cutting elements from a set of used prototype cutting elements and receiving a second set of virtual representations of at least damaged portions of cutting elements from a set of used cutting elements of a preexisting design. The sets of used prototype cutting elements and the set of used cutting elements of the preexisting design may have been used on a same earth-boring tool. A first set of quantitative measures of damage corresponding to damage for each of the first set of virtual representations of the at least damaged portions of the cutting elements and a second set of quantitative measures of damage corresponding to damage for each of the second set of virtual representations of the at least damaged portions of the cutting elements may be generated. The first and second sets of quantitative measures of damage may be normalized based on at least one of placement, damage, and work rate. Whether the set of used prototype cutting elements outperformed the set of used cutting elements of the preexisting design may be determined according to the normalized first and second sets of quantitative measures of damage by performing an analysis of variance on the normalized first and second sets of quantitative measures of damage.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
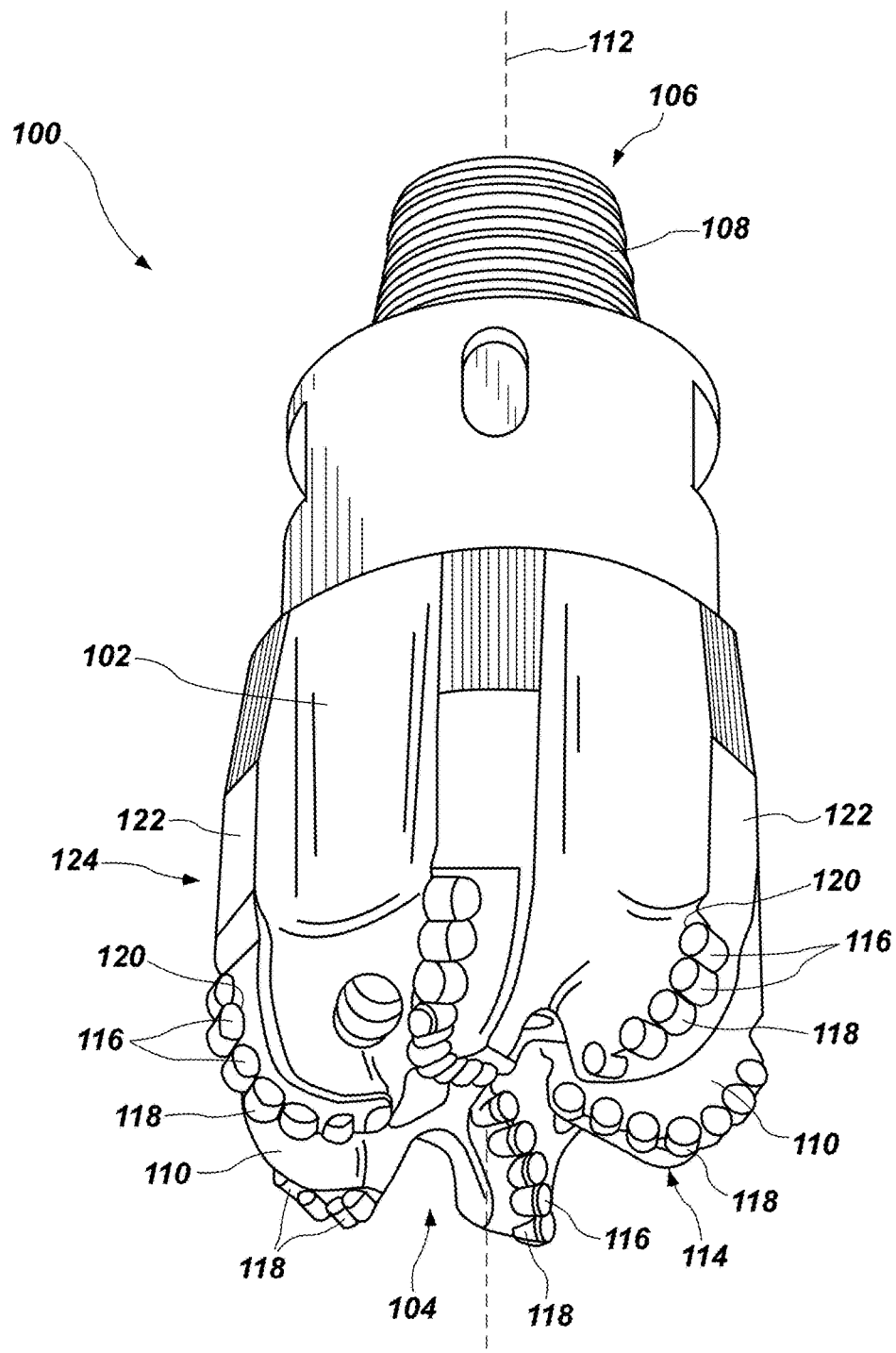
FIG. 1 is a perspective view of a mixed-cutter earth-boring tool.

The illustrations presented in this disclosure are not meant to be actual views of any particular earth-boring tool or component thereof, but are merely idealized representations employed to describe illustrative embodiments. Thus, the drawings are not necessarily to scale.

Existing methods of evaluating the performance of cutting elements often rely on the subjective evaluation of a human analyst, rendering them susceptible to human error. In addition, small, but still significant, differences in performance between cutting elements associated with one evaluation metric and cutting elements associated with another evaluation metric may be imperceptible to a human analyst. Furthermore, existing methods of evaluating the performance of cutting elements may inadequately account for differences in drilling conditions at different locations on an earth-boring tool. Finally, existing methods of simulating cutting-element performance may not accurately simulate real-world damage resistance of actual cutting elements.

Disclosed embodiments relate generally to methods of evaluating cutting elements for earth-boring tools involving rigorous analysis of damage resistance of actual, used cutting elements associated with one evaluation metric relative to damage resistance of cutting elements associated with another evaluation metric. More specifically, disclosed are embodiments of methods of evaluating cutting elements for earth-boring tools involving drilling utilizing physical cutting elements associated with one evaluation metric (e.g., being of a prototype cutting element design, being located on a prototype earth-boring tool, or being particularly suited for drilling a certain earth formation composition) and cutting elements associated with another evaluation metric (e.g., being of a preexisting cutting element design; being located on an earth-boring tool of a preexisting design, or being particularly suited for another, different earth-formation composition), measuring damage to the cutting elements of each design, optionally normalizing the measures of damage, and analyzing the measures of damage to determine whether the cutting elements associated with the one evaluation metric outperformed the cutting elements associated with the other evaluation metric. Such methods may enable those in the art of cutting element and earth-boring tool design to better and more quickly ascertain whether a chosen design outperforms another design by combining the use of real-world drilling results with tools enabling extraction of data about those results and an optional, unique method of normalizing the data to account for differences in drilling conditions at different locations on an earth-boring tool.

As used in this disclosure, the term "earth-boring tool" means and includes any type of tool having cutting elements secured to the tool used for drilling during the creation or enlargement of a wellbore in a subterranean formation. For example, earth-boring tools include fixed-cutter bits, rolling cone bits, percussion bits, core bits, eccentric bits, bicenter bits, mills, drag bits, hybrid bits, reamers, and other drilling bits and tools known in the art.

As used in this disclosure, the terms "polycrystalline table" and "polycrystalline material" mean and include any structure or material comprising grains (e.g., crystals) of a material (e.g., a superabrasive material) that are bonded directly together by inter-granular bonds. The crystal structures of the individual grains of the material may be randomly oriented in space within the polycrystalline table. For example, polycrystalline tables include polycrystalline diamond compacts (PDCs) characterized by diamond grains that are directly bonded to one another to form a matrix of diamond material with interstitial spaces among the diamond grains.

As used herein, the term "inter-granular bond" and "inter-bonded" mean and include any direct atomic bond (e.g., covalent, metallic, etc.) between atoms in adjacent grains of superabrasive material.

As used herein, the term "superhard" means and includes any material having a Knoop hardness value of about 3,000 $Kg_f/mm^2$ (29,420 MPa) or more. Superhard materials include, for example, diamond and cubic boron nitride. Superhard materials may also be characterized as "superabrasive" materials.

Referring to FIG. 1, a perspective view of an earth-boring tool 100 is shown. The particular earth-boring tool 100 shown is a mixed-cutter earth-boring tool, and may be characterized as, for example, a fixed-cutter drill bit (e.g., a drag bit). The mixed-cutter earth-boring tool 100 may include a body 102 having a leading end 104 and a trailing end 106. At the trailing end 106, the body 102 may include a connection member 108 (e.g., an American Petroleum Institute (API) threaded connection) configured to connect the mixed-cutter earth-boring tool 100 to a drill string. At the leading end 104, the body 102 may include blades 110 extending axially outwardly from a remainder of the body 102 and radially outwardly from a rotational axis 112, which may also be a central axis, of the body 102 across the leading end 104. A crown 114 of the body 102 of the mixed-cutter earth-boring tool 100 may include an outer surface defined by the blades 110 and the remainder of the body 102 at the leading end of the body 102. At least two types of cutting elements may be secured to the body 102, such as, for example, cutting elements 116 of a first design and cutting elements 118 of a second design, in some embodiments. For example, the cutting elements 116 of the first design may be prototype cutting elements or cutting elements of a preexisting design and the cutting elements 118 of the second design may be of a preexisting design (e.g., of a design typically deployed in the field for a given earth-boring tool and earth formation, which may be referred to as "baseline" cutting elements). In other embodiments, the earth-boring tool 100 may include cutting elements of only one design secured to the earth-boring tool 100. In such embodiments, another earth-boring tool may also be utilized, which may differ from the first earth-boring tool or its deployment in some respect, such as, for example, cutting element design (e.g., shape, size, configuration, material composition, or any combination of these), tool design (e.g., shape, size, configuration, material composition, or any combination of these), or composition of the earth formation to be drilled. In still other embodiments, more than two groups of cutting elements of different designs (e.g., three, four, five, or more) may be secured to the same earth-boring tool 100.

The cutting elements 116 of the first design and the cutting elements 118 of the second design may be at least partially located in pockets 120 formed in rotationally leading surfaces of the blades 110 and brazed to the surfaces of the blades 110 defining the pockets 120 to secure the cutting elements 116 of the first design and the cutting elements 118 of the second design to the body 102. In some embodiments, the cutting elements 116 of the first design may be marked with a first identifying mark and the cutting elements 118 of the second design may be marked with a second identifying mark to enable subsequent evaluators to determine which group a given cutting element 116 or 118 belongs to. For example, a rotationally rearmost surface of each cutting element 116 or 118 may be engraved, stamped, or otherwise provided with a symbol corresponding to the respective group, first or second design, to which it belongs. The cutting elements 116 of the first design and the cutting elements 118 of the second design may be distributed over the crown 114 to form a cutting structure configured to engage with and remove an underlying earth formation as the mixed-cutter earth-boring tool 100 is rotated during use. Gage pads 122 may be located at a periphery 124 of the body 102 and may define a radially outermost portion of the mixed-cutter earth-boring tool 100 in some embodiments. In other embodiments, additional cutting elements, such as the cutting elements 116 of the first design, the cutting elements 118 of the second design, or both may be secured to the body 102 at the periphery 124 to define the radially outermost portion of the mixed-cutter earth-boring tool 100.

Distribution of the cutting elements 116 of the first design and the cutting elements 118 of the second design may be at least partially randomized in some embodiments. For example, the specific blade 110 to which each of the cutting elements 116 of the first design and each of the cutting elements 118 of the second design is assigned may be at least partially randomly determined. For example, assignment of each of the cutting elements 116 of the first design and each of the cutting elements 118 of the second design to a specific blade 110 may require that each blade 110 include at least one cutting element 116 of the first design and at least one cutting element 118 of the second design attached thereto, but assignment may be otherwise randomized. In other example embodiments, one or more of the blades 110 may include only cutting elements 116 of the first design or only cutting elements 118 of the second design attached thereto as a result of complete randomization of positioning. In still other embodiments, distribution of the cutting elements 116 of the first design and the cutting elements 118 of the second design may be performed according to a predetermined sequence or pattern. For example, cutting element type may alternate with each successive distance to the pocket 120 from the rotational axis 112 or with each successive pocket 120 on each blade 110.

The cutting elements 116 of the first design and the cutting elements 118 of the second design may differ from one another in at least one characteristic in some embodiments. For example, the cutting elements 116 of the first design may exhibit at least one of a different geometric shape, a different size, a different configuration, a different orientation, and a different material composition from the cutting elements 118 of the second design. The cutting elements 118 of the second design may exhibit, for example, known characteristics and may be, for example, of a type conventionally deployed in the field for a particular earth formation type or a particular earth-boring tool.

The mixed-cutter earth-boring tool 100 may be used to drill a bore into an earth formation. For example, the mixed-cutter earth-boring tool 100 may be connected to a drill string and rotated while applying weight to the mixed-cutter earth-boring tool 100, causing the mixed-cutter earth-boring tool 100 to remove earth material from below the mixed-cutter earth-boring tool 100 and form a borehole. Drilling the borehole may damage the cutting elements 116 of the first design and the cutting elements 118 of the second design. The borehole drilled may be, for example, a test bore run purely to evaluate performance or earth formation or a commercial bore run primarily to access an underground resource (e.g., water, geothermal, or hydrocarbons) with the ancillary benefit of performance or earth formation evaluation. Data extracted from the cutting elements 116 and 118 and earth-boring tool 100 may better reflect actual performance and may be used to verify and improve simulation models because it is extracted from used, physical, real-world cutting elements 116 and 118, not computer-simulated cutting elements.

Figure 2:
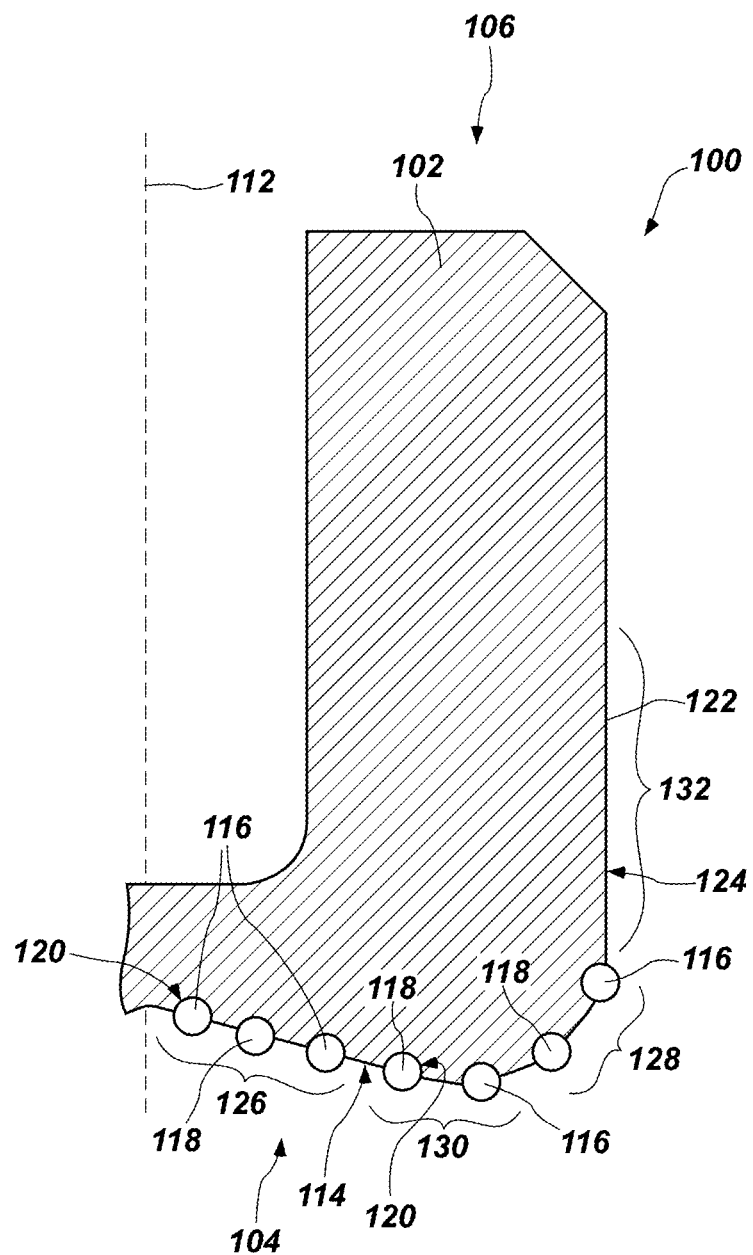
FIG. 2 is a cross-sectional view of a portion of the mixed-cutter tool of FIG. 1.

Referring to FIG. 2, a cross-sectional view of a portion of the mixed-cutter earth-boring tool 100 of FIG. 1 is shown. The crown 114 may be defined by a series of regions extending radially outwardly from the rotational axis 112 of the body 102 to the periphery 124. For example, the crown 114 may be defined by a first, cone region 126 located at and immediately surrounding the rotational axis 112. The cone region 126 may be characterized by a sloping surface extending downwardly (when the rotational axis 112 is oriented vertically with the leading end 104 facing down) located at and immediately surrounding the rotational axis 112, which may generally resemble an inverted cone shape. A second, shoulder region 128 may be located radially outward from the cone region 126 adjacent the periphery 124 of the body 102. The shoulder region 128 may be characterized by a rounded, upwardly curving surface transitioning to the periphery 124 of the body 102. A third, nose region 130 may be interposed between and adjacent to both the cone region 126 and the shoulder region 128. The nose region 130 may be characterized by a transition from the sloping surface of the cone region 126 curving toward horizontal and beginning to curve upwardly into the shoulder region 128. A fourth, gage region 132 may be located radially outward from and adjacent to the shoulder region 128 and may define the periphery 124 of the body 102.

The cutting elements 116 of the first design and the cutting elements 118 of the second design may be distributed radially across at least a portion of the crown 114 at the leading end 104 of the body 102. In some embodiments, at least one of the cutting elements 116 of the first design and at least one of the cutting elements 118 of the second design may be located in each region 126, 128, 130, and 132 in which any cutting element is located. In other embodiments, one or more of the regions 126, 128, 130, and 132 may lack cutting elements 116 of the first design, cutting elements 118 of the second design, or both.

The specific pocket 120 to which each of the cutting elements 116 of the first design and each of the cutting elements 118 of the second design is assigned may be at least partially randomly determined in some embodiments. More specifically, the radial distribution of the cutting elements 116 of the first design and the cutting elements 118 of the second design, in terms of positioning in a specific pocket 120, may be at least partially randomly determined. For example, assignment of the cutting elements 116 of the first design and the cutting elements 118 of the second design to the respective pockets 120 may require that at least one cutting element 116 of the first design and at least one cutting element 118 of the second design be attached to each blade 110, but that the assignment to pockets 120 be otherwise randomized.

In other embodiments, assignment of the cutting elements 116 and 118 to their respective locations may be performed according to a predetermined plan or pattern. For example, cutting element type may alternate with each successive distance to the pocket 120 from the rotational axis 112, with each successive pocket 120 on each blade 110, or with each successive blade 110. As another example, cutting element type may be limited to a predesignated region or regions 126, 128, 130, and 132, such as, for example, by positioning cutting elements 116 of the first design in the shoulder region 128 and cutting elements 118 of the second design in the remaining regions 126, 130, and 132.

Drilling conditions in the different regions 126, 128, 130, and 132 may significantly differ from one another. For example, cutting elements 116 and 118 in the cone region 126 may be subjected to high axial forces (i.e., forces acting in a direction parallel to the rotational axis 112 of the mixed-cutter earth-boring tool 100) resulting from the weight forcing the mixed-cutter earth-boring tool 100 toward the underlying earth formation (e.g., weight-on-bit (W.O.B.)) or a combination of high axial forces and high tangential forces (i.e., forces acting in a direction perpendicular to the rotational axis 112 of the mixed-cutter earth-boring tool 100) resulting from engagement of the cutting elements 116 and 118 with the underlying earth formation, may traverse relatively short helical cutting paths with each rotation of the mixed-cutter earth-boring tool 100, and may have a high depth of cut and correspondingly high efficiency. Cutting elements 116 and 118 in the shoulder region 128, by contrast, may be subjected to low axial forces and high tangential forces, may traverse relatively long helical cutting paths with each rotation of the mixed-cutter earth-boring tool 100, and may have a low depth of cut and correspondingly low efficiency. Cutting elements 116 and 118 in the nose region 130 may experience use conditions intermediate those present in the cone region 126 and the shoulder region 130. Cutting elements 116 and 118 in the gage region 132 may not be subjected to significant axial forces, may traverse relatively long helical paths with each rotation of the mixed-cutter earth-boring tool 100, and may have a low depth of cut and correspondingly low efficiency. Such differences in drilling conditions produce stresses at different levels and oriented in different directions and operational temperatures at different intensities in the cutting elements 116 and 118 in different regions 126, 128, 130, and 132 of the mixed-cutter earth-boring tool 100, rendering a direct comparison between the performance of a cutting element 116 or 118 in one region 126, 128, 130, or 132 and the performance of another cutting element 116 or 118 in another region 126, 128, 130, or 132 uninformative in terms of the relative performance of the cutting elements 116 and 118 themselves in at least some instances.

Figure 3:
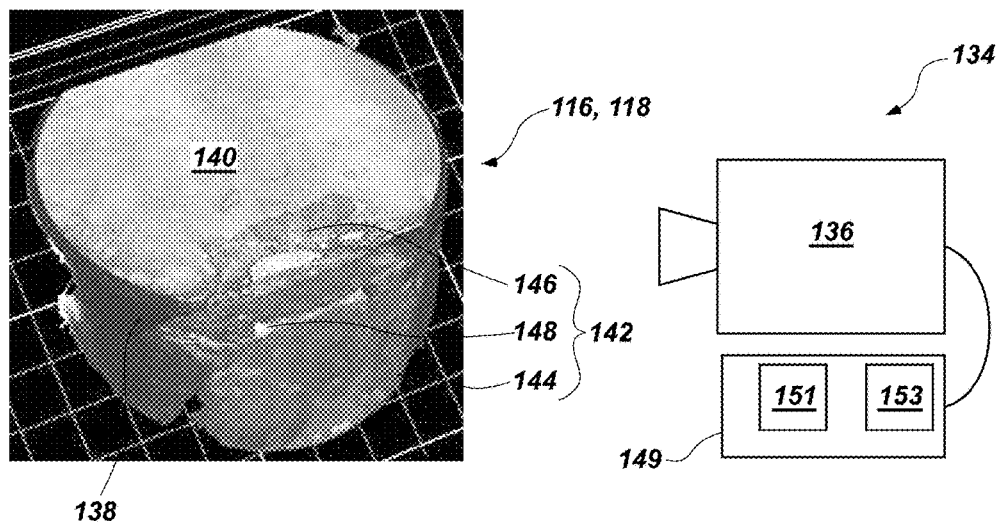
FIG. 3 is a schematic view of a system for generating quantitative measures of damage of cutting elements for earth-boring tools.

FIG. 3 is a schematic view of a system 134 for generating quantitative measures of damage of cutting elements for earth-boring tools. The system 134 may include, for example, a virtual-representation capture device 136. The virtual-representation capture device 136 may be configured to generate a virtual representation of each damaged cutting element 116 and 118 from a used mixed-cutter earth-boring tool 100. The type of virtual representation may convey sufficient information for extraction of at least one quantitative measure of damage to the respective cutting element 116 or 118. The virtual-representation capture device 136 may be, for example, a digital camera, a scanner (e.g., a microscope scanner or a three-dimensional measuring macroscope), an optoacoustic imaging device, or a confocal microscopy device (e.g., a confocal scanning acoustic microscope), each of which is known and commercially available in the art. The virtual-representation capture device 136 may generate a virtual representation of each used, damaged cutting element 116 and 118 by, for example, capturing reflected light or sound waves or by probing the respective cutting element 116 or 118.

The used, damaged cutting element 116 or 118 may include, for example, a substrate 138 of a hard material (e.g., cobalt-cemented tungsten carbide) located at a rotationally trailing end of the cutting element 116 or 118 and a polycrystalline table 140 of a superhard material at a rotationally leading end of the cutting element 116 or 118. The used, damaged cutting element 116 or 118 may include a damaged region 142 at and around a location of engagement between the cutting element 116 or 118 and an underlying earth formation. The damaged region 142 may include, for example, a wear flat 144, also referred to in the art as a "wear scar," characterized by a typically planar surface interrupting an otherwise curved outer surface of the substrate 138 and potentially of the polycrystalline table 140. The wear flat 144 may result from, for example, abrasive wear. The damaged region 142 may include, as another example, chipped and spalled regions 146 characterized by voids resulting from the flaking and chipping away of material of the polycrystalline table 140 and potentially of the substrate 138. The chipped and spalled regions 146 may be due to, for example, impact damage. The damaged region 142 may include, as yet another example, cracked regions 148 characterized by splitting material of the polycrystalline table 140 and potentially of the substrate 138. The cracked regions 148 may be due to, for example, impact damage.

The system 134 may further include a computing device 149 configured to perform at least a portion of the methods encompassed by this disclosure. For example, the computing device 149 may be operatively connected to the virtual-representation capture device 136 and may be configured to receive and analyze the virtual representations generated by the virtual-representation capture device 136. The computing device 149 may include, for example, a processing unit 151 and memory 153 operatively connected to the processing unit 151. The processing unit 151 may be rendered a special-purpose device through dedicated programming or dedicated hardware configured to receive and analyze the virtual representations generated by the virtual-representation capture device 136. For example, the computing device 149 may be programmed to generate quantitative measures of damage by analyzing the virtual representations of the cutting elements 116 and 118, optionally to normalize the quantitative measures of damage using any of a plurality of techniques and on a plurality of different bases, to evaluate the normalized quantitative measures of damage, to output which set of cutting elements 116 or 118 outperformed the other, or to perform any combination of these actions. The action or actions performed by the computing device 149 may be performed at least substantially as described hereinafter.

Figure 4A:
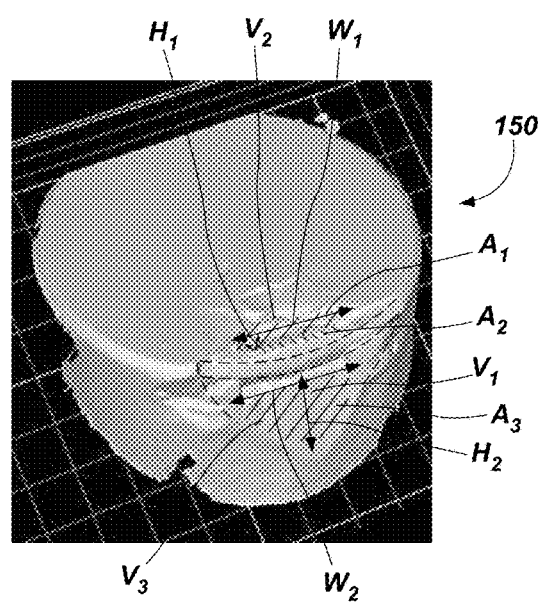
FIGS. 4A through 4C are virtual representations of a damaged cutting element.
Figure 4B:
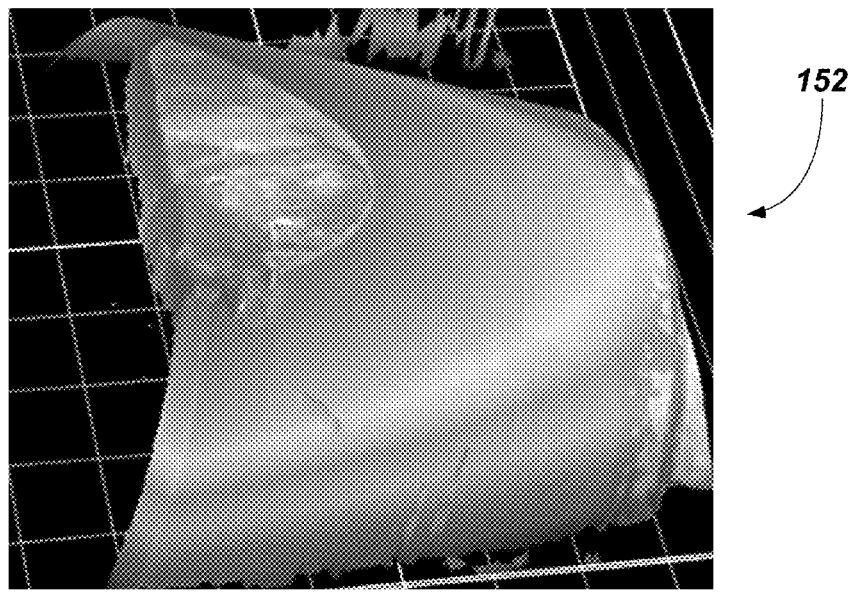
Figure 4C:
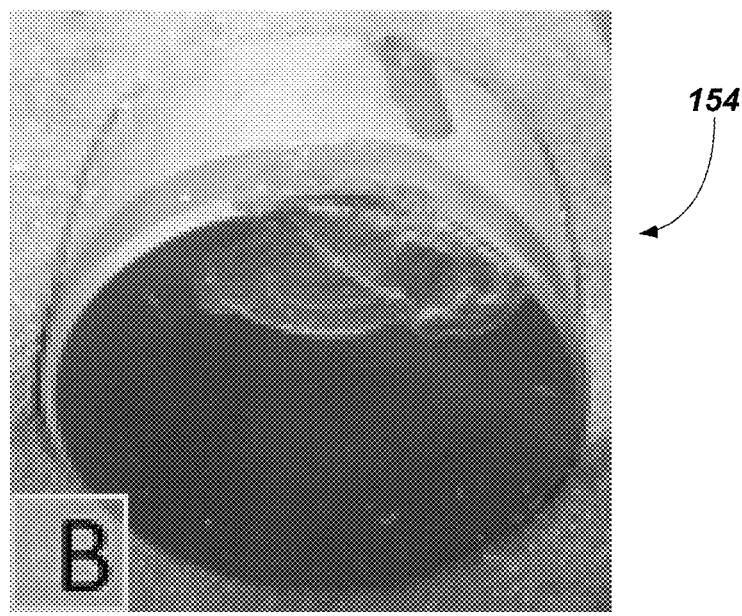

FIGS. 4A through 4C are virtual representations of at least a portion of a damaged cutting element 116 or 118 obtainable from the system 134 of FIG. 3. FIG. 4A in particular is a three-dimensional virtual representation 150 of a portion of the used, damaged cutting element 116 or 118 of FIG. 3. FIG. 4B in particular is another embodiment of a three-dimensional virtual representation 152 of a portion of the used, damaged cutting element 116 or 118 of FIG. 3. FIG. 4C is a two-dimensional virtual representation 154 (e.g., a digital photograph) of a portion of the used, damaged cutting element 116 or 118 of FIG. 3. The depicted portions in each of FIGS. 4A through 4C include the damaged region 142 (see FIG. 3) of the cutting element 116 or 118 (see FIG. 3).

As used herein, the term "virtual representation" means and includes any data file stored in a non-transitory memory device, such as the memory 153 of the computing device 149 of FIG. 3, containing information descriptive of at least a portion (e.g., a damaged portion) of a respective used, damaged cutting element 116 or 118 or a set or sets of used, damaged cutting elements 116 and 118 and from which one or more quantitative measures of damage may be automatically determined by a computing device 149 (see FIG. 3). For example, virtual representations include two-dimensional image files (e.g., .jpeg, .bmp, .tif, and .png files) and three-dimensional model files (e.g., computer-aided design (CAD) files).

After obtaining the virtual representations 150, 152, or 154 of the used, damaged cutting elements 116 and 118 (see FIG. 3), or portions thereof, at least one quantitative measure of damage corresponding to damage for each of the used, damaged cutting elements 116 and 118 may be determined in some embodiments. Determining the quantitative measures of damage may involve, for example, comparing the virtual representation 150, 152, or 154 of each used, damaged cutting element 116 and 118 to a virtual representation of an undamaged cutting element, which virtual representation of the undamaged cutting element may be generated, for example, utilizing the system 134 of FIG. 3 on an undamaged cutting element of the same respective design or may be, for example, a computer-modeled cutting element of the same respective design. Determining the quantitative measures of damage may involve, as another example, analyzing characteristics shown by the virtual representation 150, 152, or 154 of each used, damaged cutting element 116 and 118.

The quantitative measures of damage may give an indication of both the severity and type of damage. For example, and with specific reference to FIG. 4A, the quantitative measures of damage generated may provide a numerical value and associate it with total volume loss $V_1$, volume loss $V_2$ from the polycrystalline table 140 (see FIG. 3), volume loss $V_3$ from the substrate 138 (see FIG. 3), spall area $A_1$, spall height $H_1$, spall width $W_1$, spall cross-sectional area $A_2$, wear scar area $A_3$, wear scar height $H_2$, wear scar width $W_2$, crack area, crack depth, crack width, erosion volume (i.e., volume loss from the substrate 138 (see FIG. 3) attributable to abrasive wear from drilling fluids and solids suspended in drilling fluids, as opposed to abrasive wear from contact with an earth formation), or volume, cross-sectional area, width, or length of internal flaws (i.e., propagated cracks within the cutting element 116 or 118 (see FIG. 3) that are not visible from an exterior of the cutting element) for each of the respective virtual representations 150 of the relevant portions of the cutting elements 116 and 118 (see FIG. 3). Some of the quantitative measures of damage, such as, for example, volume loss, damaged area, damaged cross-sectional area, and internal flaws may be difficult or impossible to obtain by human observation and measurement. In embodiments where such quantitative measures of damage are relied on, use of the system 134 for generating quantitative measures of damage, and particularly use of the computing device 149, may be strongly recommended or even required. In some embodiments, multiple types of quantitative measures of damage may be generated for each virtual representation 150, such as, for example, any combination of those damage metrics described in the preceding sentence. For example, an optoacoustic imaging device may detect the presence, and optionally the sizes, of internal flaws within the cutting element 116 or 118. The quantitative measures of damage for those internal flaws may be generated, for example, by automatically analyzing the virtual representation 150 including the sizes of those internal flaws or by sectioning the cutting element 116 or 118 to expose the internal flaws and measuring them. In other embodiments only a single quantitative measure of damage may be generated for each virtual representation 150. Each quantitative measure of damage may be further associated with a specific cutting-element design, such that at least two sets of quantitative measures of damage are generated: a first set of quantitative measures of damage representing the damage sustained by cutting elements 116 (see FIG. 3) of the first design and a second set of quantitative measures of damage representing the damage sustained by cutting elements 118 (see FIG. 3) of the second design.

In other embodiments, at least one qualitative measure of damage corresponding to damage for each of the used, damaged cutting elements 116 and 118 may be determined. For example, a human evaluator may assign a qualitative measure of damage on a ranking scale (e.g., on a binary, three-point, five-point, or ten-point ranking scale) to each of the used, damaged cutting elements 116 and 118. The qualitative measures of damage may give an indication of the type of damage by associating with qualitative measures of damage with a specific metric, such as, for example, those described in the preceding paragraph, and the severity of the damage as reflected by the assigned value on the ranking scale. The assigned ranking may be based, for example, on the comparative damage between the cutting elements 116 and 118 or on the perceived absolute value of damage to the cutting elements 116 and 118. Because the qualitative measures of damage require individual, numerical rankings, as compared to an overall impression, even utilizing the qualitative measures of damage may reduce the impact of human judgment and bias on the evaluation.

Figure 5:
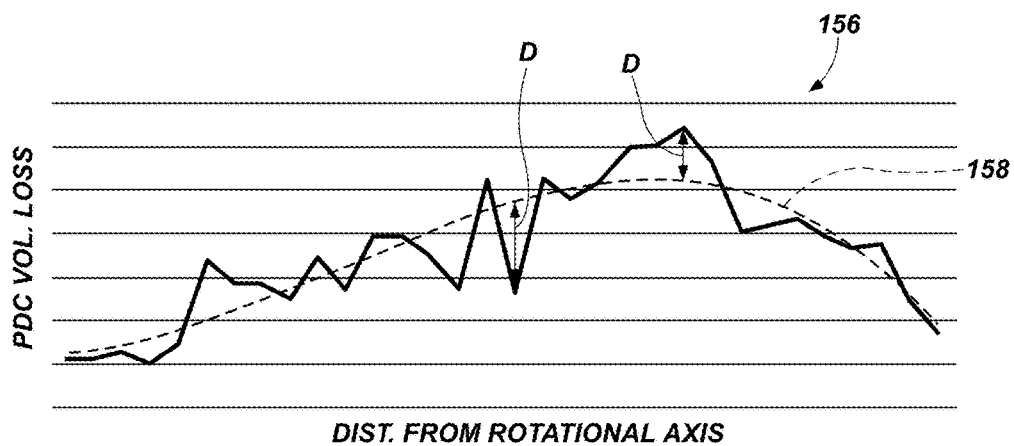
FIG. 5 is a graph of a normalization function.

After obtaining the measures of damage, whether quantitative or qualitative, each measure of damage may be normalized to account for the different working conditions experienced by the cutting elements 116 and 118 in different regions 126 through 132 of a mixed-cutter earth-boring tool 100 (see FIG. 2) in some embodiments. Normalization may be based on a variety of factors, such as, for example, relative placement on the mixed-cutter earth-boring tool 100 (see FIG. 1), work rate, measure of damage, predicted loads, actual loads experienced, operating temperature, heat flux, position, orientation, velocity, or exposure above the outer surface of the mixed-cutter earth-boring tool 100 (see FIG. 1). For example, FIG. 5 is a graph 156 of a normalization function for normalizing the measures of damage based on relative placement. Specifically FIG. 5 depicts the volume lost from the polycrystalline table 140 (see FIG. 3) on the vertical axis and radial distance from the rotational axis 112 (see FIG. 1) on the horizontal axis. The measures of damage are then plotted on the graph 156. In other embodiments, a different measure of damage, such as, for example, any of those described in the preceding paragraph, may be plotted on the vertical axis and a different normalizing metric, such as, for example, any of those described previously in this paragraph, may be plotted on the horizontal axis. In some embodiments, separate graphs 156 may be generated for separate sets of measures of damage: one for the cutting elements 116 of the first design and another for the cutting elements 118 of the second design, to directly compare the normalization curves subsequently generated. In other embodiments, a single graph 156 may be generated for both sets of measures of damage to jointly normalize the measures of damage. In still other embodiments, a single graph 156 may be generated for one set of measures of damage (e.g., the set associated with the prototype cutting elements 116 or the set associated with the cutting elements 118 of the preexisting design) to normalize each set of measures of damage.

A curve 158 may be fit to the measures of damage on the graph 156. The curve 158 may be, for example, a polynomial fit curve, such as, for example, a second-, third-, or fourth-order polynomial fit curve. The measures of damage may be normalized by, for example, subtracting a difference D between each respective actual measure of damage and each respective curved measure of damage of the curve 158 at each corresponding distance from the rotational axis 112 of the mixed-cutter earth-boring tool 100 (see FIG. 1) from each respective actual measure of damage.

Figure 6:
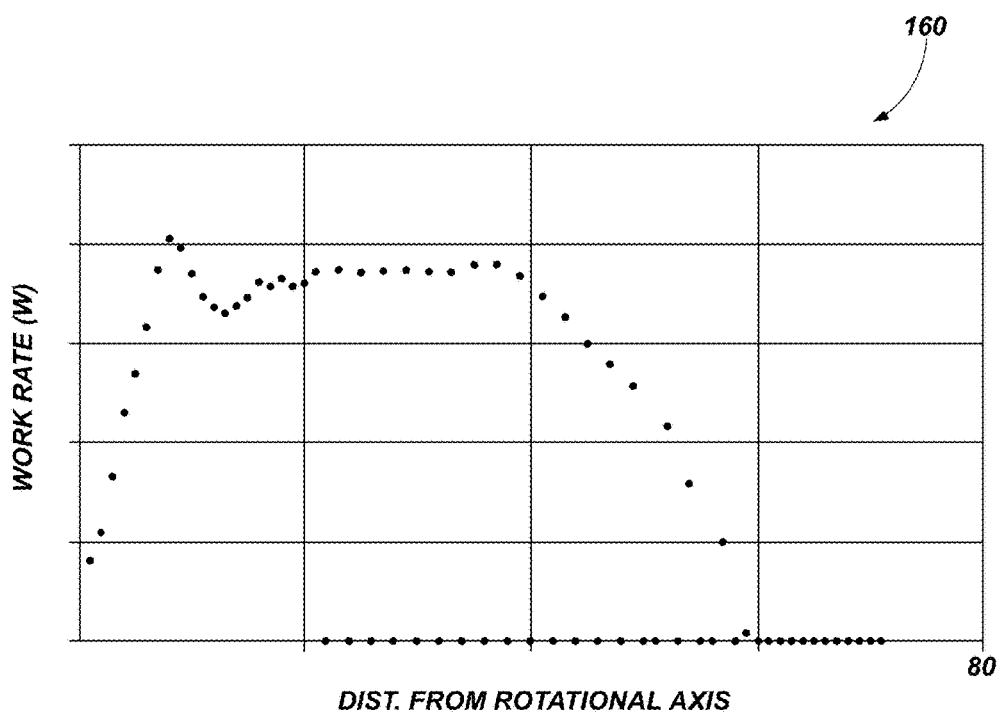
FIG. 6 is a work rate curve for generating normalization.

As an example of a technique for normalizing the measures of damage other than using a curve fit, normalization may be performed using ratio balancing. For example, FIG. 6 is a work rate curve 160 for generating normalization ratios. Specifically FIG. 6 depicts the work rate (i.e., the normal force acting on a cutting element multiplied by the velocity of the cutting element) on the vertical axis and radial distance from the rotational axis 112 (see FIG. 1) on the horizontal axis. The work rate may be sensed utilizing downhole sensors or may be estimated through simulation. The work rates experienced by cutting elements 116 and 118 are then plotted on the graph 156 (see FIG. 5). In other embodiments, a normalizing metric, such as, for example, any of those described previously in this disclosure, may be plotted on the vertical axis, and may be sensed utilizing downhole sensors or estimated through simulation. In some embodiments, separate curves 160 may be generated for separate sets of measures of damage: one for the cutting elements 116 of the first design and another for the cutting elements 118 of the second design, to directly compare the normalization curves subsequently generated. In other embodiments, a single curve 160 may be generated for both sets of measures of damage to jointly normalize the quantitative measures of damage. In still other embodiments, a single curve 160 may be generated for one set of measures of damage (e.g., the set associated with the prototype cutting elements 116 or the set associated with the cutting elements 118 of the preexisting design) to normalize each set of measures of damage.

In one example of ratio-based normalization, each work rate of each used cutting element 116, 118, or both plotted on the curve 160 may be divided by a greatest work rate experienced by any cutting element 116, 118, or both to generate a set of work rate ratios. Each measure of damage associated with the respective cutting elements 116, 118, or both may be divided by its corresponding work rate ratio to normalize the measures of damage. As another example of ratio-based normalization, each measure of damage corresponding to the respective cutting elements 116, 118, or both may be divided by a measure of damage of a respective cutting element 116, 118, or both having experienced a greatest work rate to normalize the measures of damage.

As another example, normalization-function-based and ratio-based normalization may be performed without plotting any graphs. For example, regression analysis, a statistical process known to those of skill in the art, may be used to generate the relevant curves.

In some embodiments, a combined measure of damage may be generated by multiplying a base measure of damage by a downhole environmental measurement measurable for respective cutting elements 116 and 118. Downhole environmental measurements usable to generate the combined measures of damage may include, for example, vibrations, temperatures, work rates, accelerations, normal forces, and averages, maximums, and minimums of such measurable factors. For example, each measure of damage may be multiplied by an average, maximum, or minimum vibration intensity, direction, or both corresponding to vibration experienced on a respective blade to which each cutting element was secured. Combining the raw measures of damage with measured downhole environmental factors to generate the combined measures of damage may better account for the differences in environment experienced by cutting elements in different regions of the earth-boring tool and drilling through different compositions of earth formation even within the same borehole.

Figure 7:
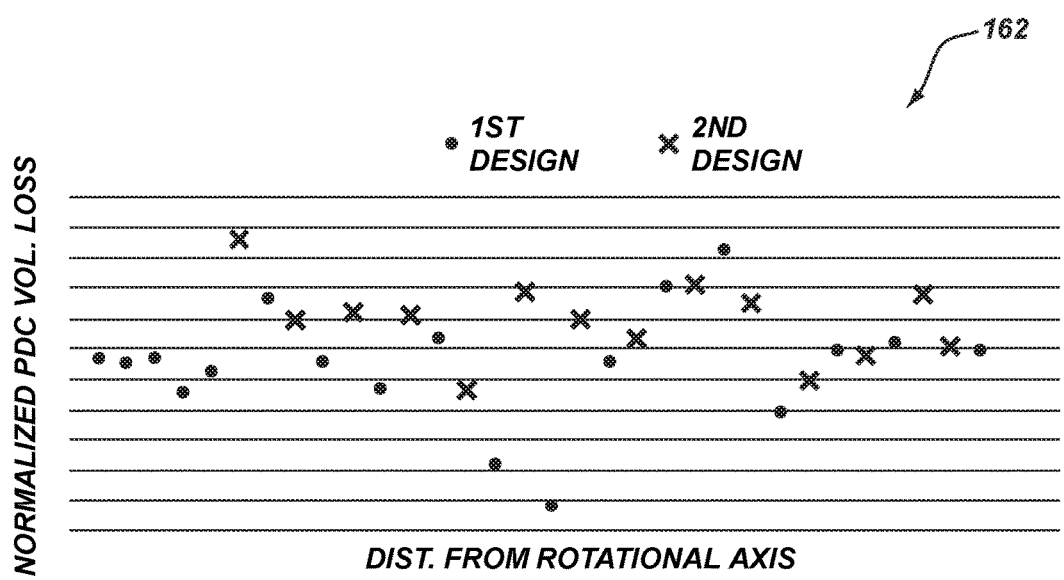
FIG. 7 is a graph of normalized measures of damage of cutting elements.

FIG. 7 is a graph 162 of the measures of damage shown in FIG. 5 after normalization. As shown in FIGS. 5 and 7, the normalized measures of damage differ significantly from the measures of damage pre-normalization. The normalized measures of damage corresponding to both the cutting elements 116 of the first design and the cutting elements 118 of the second design (see FIG. 1) are both shown in FIG. 7. Such normalization of the measures of damage may enable comparison of performance between the cutting elements 116 of the first design and the cutting elements 118 of the second design because it accounts for the differences in drilling conditions experienced in the different regions 126 through 132 of a mixed-cutter earth-boring tool 100 (see FIG. 1).

Returning to FIG. 1, the normalized measures of damage may then be analyzed to determine whether the cutting elements 116 of the first design outperformed the cutting elements 118 of the second design. For example, the normalized quantitative measures of damage may be separated into two sets: one corresponding to the respective cutting elements 116 of the first design and another corresponding to the cutting elements 118 of the second design. Subsequently, for example, an analysis of variance (ANOVA) may be performed on the sets of normalized quantitative measures of damage. ANOVA is a known technique for performing statistical analysis particularly suited to determining whether differences between two or more data sets are significant and to what degree of confidence that significance is known.

As another example, the normalized quantitative measures of damage may be analyzed by comparing an average normalized quantitative measure of damage associated with the cutting elements 116 of the first design to an average normalized quantitative measure of damage associated with the cutting elements 118 of the second design. The smaller average normalized quantitative measure of damage may indicate the best-performing set of cutting elements 116 or 118. The variance of the normalized quantitative measures of damage may also be evaluated to determine whether the differences in the average normalized quantitative measures of damage are statistically significant.

As yet another example, the normalized quantitative measures of damage may be analyzed by comparing the normalization curves 158 (see FIG. 5) to one another directly. For example, an area under each curve 158 (see FIG. 5) may be determined (e.g., by integrating the curve 158 over the relevant range), and the smallest area may indicate the best-performing set of cutting elements 116 or 118. Utilizing this method, many curves 158 may be evaluated by calculating the area under each and performing an analysis on the set of areas under the relevant curves 158, which may enable a more robust comparison.

In some embodiments, the normalized measures of damage may be further normalized before evaluating the relative performance of the cutting elements 116 and 118. For example, an average of normalized measures of damage associated with each of two used cutting elements 116 or 118 laterally adjacent (e.g., located adjacent to one another on the same blade or located in radially adjacent positions with respect to the rotational axis 112 of the earth-boring tool 100 (FIG. 1), regardless of which blade they are secured to) to a respective used cutting element 116 or 118 may be divided by a normalized measure of damage associated with the respective used cutting element 116, 118 to generate a comparative performance ratio for each respective used cutting element 116 and 118. The comparative performance ratios may be divided into sets: one corresponding to the respective cutting elements 116 of the first design and another corresponding to the cutting elements 118 of the second design. Subsequently, one of the analytical methods described previously in this disclosure may be performed on the sets of comparative performance ratios to determine whether one set of cutting elements 116 or 118 outperformed the other set of cutting elements 116 or 118, whether that difference in performance was significant, and to what degree of confidence the evaluators can be sure the difference in performance was significant.

In other embodiments, the measures of damage may not be normalized. For example, any of the evaluation techniques for comparing performance described in this disclosure may be performed directly on the measures of damage without normalization.

The methods for evaluating cutting elements described herein may be applicable to evaluation of other designs, such as, for example, designs of earth-boring tools. For example, two or more different earth-boring tools may drill boreholes in the same or similar earth formations, quantitative measures of damage to the earth-boring tools may be obtained from the tools, the quantitative measures of damage may be normalized, and differences in the normalized quantitative measures of damage may be evaluated to determine whether they are significant. As another example, two earth-boring tools having only cutting elements of the same design may be used to drill two separate bores, one tool for each bore. The tools may differ from one another in some characteristic (e.g., geometric shape, configuration, size, material composition) in some embodiments, which may enable evaluators to analyze the impact of tool design on cutting element performance. In other embodiments, the earth formations drilled may differ in composition, which may enable evaluators to analyze the suitability of the cutting elements for a particular earth formation composition.

In addition, the methods for evaluating cutting elements described in this disclosure may enable validation and improvement of existing methods of simulating cutting elements. For example, the results of a real-world drilling operation may be compared to the results of a simulated drilling operation by obtaining measures of damage from the physical tools and the simulated tools, normalizing the measures of damage, and evaluating the measures of damage to determine whether any differences are significant.

The methods for evaluating cutting elements described in this disclosure may further be applied to other cutting structures and tools used to drill an earth formation. For example, different designs for inserts on rolling cones of a roller-cone bit, different designs for cones or other structures of a roller-cone bit, different hardfacing compositions applied to earth-boring tools, and different impregnated material compositions for impregnated bits may be evaluated utilizing the methods of this disclosure.

Furthermore, the methods for evaluating cutting elements described in this disclosure may enable designers to perceive smaller, though still significant, differences in performance and to more quickly determine whether a given design is preferable.

Finally, the performance of cutting elements from different earth-boring tools may be compared to one another, which may involve normalizing based on other metrics or performing multiple normalization procedures before performing any comparative analysis. For example, additional normalization may be performed on the basis of earth-boring tool type and earth formation composition. Expanding the sets of measures of damage to include measures of damage corresponding to two sets of cutting elements 116 and 118 of different designs from multiple drilling runs, in multiple formation types, and on multiple different tool designs may enable much more robust and informative evaluation of the cutting elements 116 and 118. To that end, a distributed network of digital scanning centers and earth-boring tool manufacturing and repair centers may obtain measures of damage for cutting elements, and optionally for bodies of the earth-boring tools, from each used earth-boring tool. The analytical methods described in this disclosure may then be applied on a much greater scale, enabling comparison between a greater number of cutting element designs, earth-boring tool designs, earth formation compositions drilled, and other factors.

Additional, nonlimiting embodiments within the scope of this disclosure include:

Embodiment 1

A method of evaluating a set of cutting elements for an earth-boring tool, comprising: having a borehole drilled by a mixed-cutter earth-boring tool comprising a first set of cutting elements and a second set of cutting elements secured to the mixed-cutter earth-boring tool to produce a first set of used cutting elements and a second set of used cutting elements; generating a first set of virtual representations of at least portions of the cutting elements from the first set of used cutting elements; generating a second set of virtual representations of at least portions of the cutting elements from the second set of used cutting elements; determining a first set of measures of damage corresponding to damage for each of the first set of virtual representations of the at least portions of the used cutting elements; determining a second set of measures of damage corresponding to damage for each of the second set of virtual representations of the at least portions of the used cutting elements; and identifying a best-performing set of cutting elements from the first and second sets of used cutting elements according to the first and second sets of measures of damage.

Embodiment 2

The method of Embodiment 1, wherein identifying the best-performing set of cutting elements from the first and second sets of used cutting elements comprises normalizing the first and second sets of measures of damage based on at least one of placement, damage, and work rate.

Embodiment 3

The method of Embodiment 2, wherein normalizing the first and second sets of measures of damage comprises: plotting each of the first and second sets of measures of damage on a graph having a value of the measures of damage on one axis and distance of respective used cutting elements of the first and second sets of used cutting elements from a central axis of the same earth-boring tool on another, perpendicular axis; fitting a curve to the first and second sets of measures of damage on the graph; and subtracting a difference between each respective measure of damage of the first and second sets of measures of damage and each respective curved measure of damage of the curve at each corresponding radial distance from the central axis of the same earth-boring tool from each respective measure of damage of the first and second sets of measures of damage to obtain the normalized first and second sets of measures of damage.

Embodiment 4

The method of Embodiment 2, wherein normalizing the first and second sets of measures of damage comprises: performing a regression analysis to generate a curve fit to the first and second sets of measures of damage with respect to distance of respective used cutting elements of the first and second sets of used cutting elements from a central axis of the same earth-boring tool; and subtracting a difference between each respective measure of damage of the first and second sets of measures of damage and each respective curved measure of damage of the curve at each corresponding radial distance from the central axis of the same earth-boring tool from each respective measure of damage of the first and second sets of measures of damage to obtain the normalized first and second sets of measures of damage.

Embodiment 5

The method of Embodiment 2, wherein normalizing the first and second sets of measures of damage comprises calculating a curve fit on only one of the first and second sets of measures and subtracting a difference between each measure of damage of the respective first and second sets of measures of damage and each respective measure of damage of the curve at each corresponding radial distance from the central axis of the same earth-boring tool from each respective measure of damage of the first and second sets of measures of damage to obtain the normalized first and second sets of measures of damage.

Embodiment 6

The method of Embodiment 2, wherein normalizing the first and second sets of measures of damage comprises: determining a work rate of each used cutting element of the first and second sets of used cutting elements during use; dividing each work rate of each used cutting element of the first and second sets of used cutting elements by a greatest work rate experienced by a cutting element of the first and second sets of used cutting elements to generate a set of work rate ratios; and dividing each measure of damage of the first and second sets of measures of damage by a respective work rate ratio of the set of work rate ratios corresponding to a respective cutting element of the first and second sets of used cutting elements for each measure of damage.

Embodiment 7

The method of Embodiment 2, wherein normalizing the first and second sets of measures of damage comprises: determining a work rate of each used cutting element of the first and second sets of used cutting elements during use; and dividing each measure of damage of the first and second sets of measures of damage by a quantitative measure of damage of a respective cutting element of the first and second sets of used cutting elements having experienced a greatest work rate.

Embodiment 8

The method of any one of Embodiments 1 through 7, wherein identifying the best-performing set of cutting elements from the first and second sets of used cutting elements comprises identifying the best-performing set of cutting elements between a set of prototype cutting elements and a set of cutting elements of a preexisting design.

Embodiment 9

The method of any one of Embodiments 1 through 8, wherein determining the first and second sets of measures of damage corresponding to damage for each of the respective first and second sets of virtual representations of the at least portions of the cutting elements comprises quantitatively determining at least one of volume loss, spall area, spall height, spall width, spall cross-sectional area, wear scar area, wear scar height, wear scar width, size of internal flaws, and quantity of internal flaws for each of the respective first and second sets of virtual representations of the at least portions of the cutting elements.

Embodiment 10

The method of any one of Embodiments 1 through 8, wherein determining the first and second sets of measures of damage corresponding to damage for each of the first and second sets of virtual representations of the at least portions of the cutting elements comprises digitally analyzing photographs of the at least portions of the used cutting elements from the first and second sets of used cutting elements to generate first and second sets of quantitative measures of damage.

Embodiment 11

The method of any one of Embodiments 1 through 7, 9, and 10, wherein identifying the best-performing set of cutting elements from the first and second sets of used cutting elements according to the first and second sets of measures of damage comprises generating first and second sets of comparative performance ratios corresponding to the first and second sets of used cutting elements by dividing an average of measures of damage associated with each of two used cutting elements laterally adjacent to a respective used cutting element by a measure of damage associated with the respective used cutting element for each of the measures of damage and performing an analysis of variance on the first and second sets of comparative performance ratios.

Embodiment 12

The method of any one of Embodiments 1 through 7, 9, and 10, wherein identifying the best-performing set of cutting elements from the first and second sets of used cutting elements according to the first and second sets of quantitative measures of damage comprises performing an analysis of variance on the first and second sets of quantitative measures of damage.

Embodiment 13

The method of any one of Embodiments 1 through 8, 10, and 11, wherein generating the first and second sets of virtual representations of the at least portions of the cutting elements from the first and second sets of used cutting elements comprises scanning the at least a portion of each cutting element of the first and second sets of used cutting elements utilizing at least one of a scanner, a confocal scanning acoustic microscope, an optoacoustic imaging device, a three-dimensional measuring macroscope, and a confocal microscopy device.

Embodiment 14

The method of any one of Embodiments 1 through 13, further comprising marking each cutting element of the first and second sets of cutting elements with a respective identifying mark before using each cutting element of the first and second sets of cutting elements.

Embodiment 15

A computer-implemented method of determining whether a prototype cutting element for an earth-boring tool performs better than a cutting element of a preexisting design for the earth-boring tool, comprising: receiving at a non-transitory memory of a computing device a first set of virtual representations of at least damaged portions of cutting elements from a set of used prototype cutting elements; receiving at the non-transitory memory of the computing device a second set of virtual representations of at least damaged portions of cutting elements from a set of used cutting elements of a preexisting design, the sets of used prototype cutting elements and the set of used cutting elements of the preexisting design having been used on a same earth-boring tool; generating at a processing unit of the computing device a first set of quantitative measures of damage corresponding to damage for each of the first set of virtual representations of the at least damaged portions of the cutting elements; generating at the processing unit of the computing device a second set of quantitative measures of damage corresponding to damage for each of the second set of virtual representations of the at least damaged portions of the cutting elements; normalizing at the processing unit of the computing device the first and second sets of quantitative measures of damage based on at least one of placement, damage, and work rate; and determining at the processing unit of the computing device whether the set of used prototype cutting elements outperformed the set of used cutting elements of the preexisting design according to the normalized first and second sets of quantitative measures of damage by performing an analysis of variance on the normalized first and second sets of quantitative measures of damage.

Embodiment 16

The method of Embodiment 15, wherein generating the first and second sets of quantitative measures of damage corresponding to damage for each of the respective first and second sets of virtual representations of the at least damaged portions of the cutting elements comprises determining at least one of volume loss, spall area, spall height, spall width, spall cross-sectional area, wear scar area, wear scar height, wear scar width, size of internal flaws, and quantity of internal flaws for each of the respective first and second sets of virtual representations of the at least damaged portions of the cutting elements.

Embodiment 17

The method of Embodiment 15 or Embodiment 16, wherein normalizing the first and second sets of quantitative measures of damage comprises: determining a work rate of each used cutting element of the set of used prototype cutting elements and the set of used cutting elements of the preexisting design during use; dividing each work rate of each used cutting element of the set of used prototype cutting elements and the set of used cutting elements of the preexisting design by a greatest work rate experienced by a cutting element of the set of used prototype cutting elements and the set of used cutting elements of the preexisting design to generate a set of work rate ratios; and dividing each quantitative measure of damage of the first and second sets of quantitative measures of damage by a respective work rate ratio of the set of work rate ratios corresponding to a respective cutting element of the set of used prototype cutting elements and the set of used cutting elements of the preexisting design for each quantitative measure of damage.

Embodiment 18

The method of any one of Embodiments 15 through 17, wherein determining whether the set of used prototype cutting elements outperformed the set of used cutting elements of the preexisting design comprises generating first and second sets of comparative performance ratios corresponding to the set of used prototype cutting elements and the set of used cutting elements of the preexisting design by dividing an average of normalized quantitative measures of damage associated with each of two used cutting elements laterally adjacent to a respective used cutting element by a normalized quantitative measure of damage associated with the respective used cutting element for each of the normalized quantitative measures of damage and performing an analysis of variance on the first and second sets of comparative performance ratios.

Embodiment 19

The method of any one of Embodiments 15 through 18, wherein receiving the first and second sets of quantitative measures of damage comprises digitally analyzing photographs of the at least damaged portions of the used cutting elements from the set of used prototype cutting elements and the set of used cutting elements of the preexisting design.

Embodiment 20

The method of any one of Embodiments 15 through 18, wherein receiving the first and second sets of virtual representations of the at least damaged portions of the cutting elements from the set of used prototype cutting elements and the set of used cutting elements of the preexisting design comprises scanning the at least damaged portions of each cutting element of the set of used prototype cutting elements and the set of used cutting elements of the preexisting design utilizing at least one of a microscope scanner, a confocal scanning acoustic microscope, an optoacoustic imaging device, a three-dimensional measuring macroscope, and a confocal microscopy device.

Embodiment 21

The method of any one of Embodiments 15 through 20, further comprising marking each cutting element of the set of prototype cutting elements and the set of cutting elements of the preexisting design with a respective identifying mark before using each cutting element of the set of prototype cutting elements and the set of cutting elements of the preexisting design.

Embodiment 22

A method of evaluating a set of cutting elements for an earth-boring tool, comprising: having a borehole drilled by a mixed-cutter earth-boring tool comprising a first set of cutting elements and a second set of cutting elements secured to the mixed-cutter earth-boring tool; generating a first set of virtual representations of at least portions of the cutting elements from the first set of used cutting elements;

generating a second set of virtual representations of at least portions of the cutting elements from the second set of used cutting elements; determining a first set of quantitative measures of damage corresponding to damage for each of the first set of virtual representations of the at least portions of the cutting elements; determining a second set of quantitative measures of damage corresponding to damage for each of the second set of virtual representations of the at least portions of the cutting elements; normalizing the first and second sets of quantitative measures of damage based on at least one of placement, damage, and work rate; and identifying a best-performing set of cutting elements from the first and second sets of used cutting elements according to the normalized first and second sets of quantitative measures of damage.

Embodiment 23

A method of evaluating a set of cutting elements for an earth-boring tool, comprising: generating at a processing unit of a computing device a first set of virtual representations of at least portions of cutting elements from a first set of used cutting elements; generating at the processing unit of the computing device a second set of virtual representations of at least portions of cutting elements from a second set of used cutting elements, the first and second sets of used cutting elements having been used on a same earth-boring tool; determining at the processing unit of the computing device a first set of quantitative measures of damage corresponding to damage for each of the first set of virtual representations of the at least portions of the cutting elements; determining at the processing unit of the computing device a second set of quantitative measures of damage corresponding to damage for each of the second set of virtual representations of the at least portions of the cutting elements; normalizing at the processing unit of the computing device the first and second sets of quantitative measures of damage based on at least one of placement, damage, and work rate; and identifying at the processing unit of the computing device a best-performing set of cutting elements from the first and second sets of used cutting elements according to the normalized first and second sets of quantitative measures of damage.

Embodiment 24

A method of evaluating a set of cutting elements for an earth-boring tool, comprising: having a borehole drilled by a mixed-cutter earth-boring tool comprising a first set of cutting elements and a second set of cutting elements secured to the mixed-cutter earth-boring tool; generating at a processing unit of a computing device a first set of virtual representations of at least portions of the cutting elements from the first set of used cutting elements; generating at the processing unit of the computing device a second set of virtual representations of at least portions of the cutting elements from the second set of used cutting elements; determining at the processing unit of the computing device a first set of quantitative measures of damage corresponding to damage for each of the first set of virtual representations of the at least portions of the cutting elements; determining at the processing unit of the computing device a second set of quantitative measures of damage corresponding to damage for each of the second set of virtual representations of the at least portions of the cutting elements; normalizing at the processing unit of the computing device the first and second sets of quantitative measures of damage based on at least one of placement, damage, and work rate; and identifying at the processing unit of the computing device a best-performing set of cutting elements from the first and second sets of used cutting elements according to the normalized first and second sets of quantitative measures of damage.

Embodiment 25

A computer-implemented method of determining whether a prototype cutting element for an earth-boring tool performs better than a cutting element of a preexisting design for the earth-boring tool, comprising: receiving at a non-transitory memory of a computing device a first set of virtual representations of at least damaged portions of cutting elements from a set of used prototype cutting elements; receiving at the non-transitory memory of the computing device a second set of virtual representations of at least damaged portions of cutting elements from a set of used cutting elements of a preexisting design, the sets of used prototype cutting elements and the set of used cutting elements of the preexisting design having been used on a same earth-boring tool; generating at a processing unit of the computing device a first set of quantitative measures of damage corresponding to damage for each of the first set of virtual representations of the at least damaged portions of the cutting elements; generating at the processing unit of the computing device a second set of quantitative measures of damage corresponding to damage for each of the second set of virtual representations of the at least damaged portions of the cutting elements; normalizing at the processing unit of the computing device the first and second sets of quantitative measures of damage based on at least one of placement, damage, and work rate; and determining at the processing unit of the computing device whether the set of used prototype cutting elements outperformed the set of used cutting elements of the preexisting design according to the normalized first and second sets of quantitative measures of damage by performing an analysis of variance on the normalized first and second sets of quantitative measures of damage.

Embodiment 26

A method of determining whether a prototype cutting element for an earth-boring tool performs better than a cutting element of a preexisting design for the earth-boring tool, comprising: drilling a test bore utilizing a mixed-cutter earth-boring tool comprising a set of prototype cutting elements and a set of cutting elements of a preexisting design secured to the mixed-cutter earth-boring tool; receiving a first set of virtual representations of at least damaged portions of the cutting elements from the set of used prototype cutting elements; receiving a second set of virtual representations of at least damaged portions of the cutting elements from the set of used cutting elements of the preexisting design; generating a first set of quantitative measures of damage corresponding to damage for each of the first set of virtual representations of the at least damaged portions of the cutting elements; generating a second set of quantitative measures of damage corresponding to damage for each of the second set of virtual representations of the at least damaged portions of the cutting elements; normalizing at the processing unit of the computing device the first and second sets of quantitative measures of damage based on at least one of placement, damage, and work rate; and determining whether the set of used prototype cutting elements outperformed the set of used cutting elements of the preexisting design according to the normalized first and second sets of quantitative measures of damage by performing an analysis of variance on the normalized first and second sets of quantitative measures of damage.

Embodiment 27: A computer-implemented method of determining whether a prototype cutting element for an earth-boring tool performs better than a cutting element of a preexisting design for the earth-boring tool, comprising: drilling a test bore utilizing a mixed-cutter earth-boring tool comprising a set of prototype cutting elements and a set of cutting elements of a preexisting design secured to the mixed-cutter earth-boring tool; receiving at a non-transitory memory of a computing device a first set of virtual representations of at least damaged portions of the cutting elements from the set of used prototype cutting elements; receiving at the non-transitory memory of the computing device a second set of virtual representations of at least damaged portions of the cutting elements from the set of used cutting elements of the preexisting design, the sets of used prototype cutting elements and the set of used cutting elements of the preexisting design having been used on a same earth-boring tool; generating at a processing unit of the computing device a first set of quantitative measures of damage corresponding to damage for each of the first set of virtual representations of the at least damaged portions of the cutting elements; generating at the processing unit of the computing device a second set of quantitative measures of damage corresponding to damage for each of the second set of virtual representations of the at least damaged portions of the cutting elements; normalizing at the processing unit of the computing device the first and second sets of quantitative measures of damage based on at least one of placement, damage, and work rate: and determining at the processing unit of the computing device whether the set of used prototype cutting elements outperformed the set of used cutting elements of the preexisting design according to the normalized first and second sets of quantitative measures of damage by performing an analysis of variance on the normalized first and second sets of quantitative measures of damage.

Embodiment 28

A computer-implemented method of determining whether a prototype earth-boring tool outperforms an earth-boring tool of a preexisting design, comprising: generating at a processing unit of a computing device quantitative measures of damage corresponding to damage of virtual representations of at least damaged portions of used cutting elements of a same design from the prototype earth-boring tool and the earth-boring tool of the preexisting design; optionally normalizing at the processing unit of the computing device the quantitative measures of damage based on at least one of placement, damage, and work rate; and determining at the processing unit of the computing device whether the prototype bit design outperformed the preexisting design based on the quantitative measures of damage using analysis of variance.

Embodiment 29

A method of evaluating earth-boring tool designs, comprising: drilling a first borehole with a first earth-boring tool of a first design, a first set of cutting elements being secured to the first earth-boring tool, to produce a first set of used cutting elements; drilling a second borehole with a second earth-boring tool of a second, different design, a second set of cutting elements being secured to the second earth-boring tool, to produce a second set of used cutting elements, the first and second sets of cutting elements being of the same design; generating a first set of virtual representations of at least portions of the cutting elements from the first set of used cutting elements; generating a second set of virtual representations of at least portions of the cutting elements from the second set of used cutting elements; determining a first set of measures of damage corresponding to damage for each of the first set of virtual representations of the at least portions of the used cutting elements; determining a second set of measures of damage corresponding to damage for each of the second set of virtual representations of the at least portions of the used cutting elements; and identifying a best-performing earth-boring tool design from the first and second designs of the first and second earth-boring tools according to the first and second sets of measures of damage by statistically analyzing the first and second sets of measures of damage.

Embodiment 30

A method of evaluating earth formations comprising: drilling a first borehole in a first earth formation utilizing a first earth-boring tool comprising a first set of cutting elements secured to the first earth-boring tool to produce a first set of used cutting elements; drilling a second, different borehole in a second, different earth formation utilizing a second earth-boring tool comprising a second set of cutting elements secured to the second earth-boring tool to produce a second set of used cutting elements, the first and second earth-boring tools being of at least substantially the same design, the first and second sets of cutting elements being of at least substantially the same design; generating a first set of virtual representations of at least portions of the cutting elements from the first set of used cutting elements; generating a second set of virtual representations of at least portions of the cutting elements from the second set of used cutting elements; determining a first set of measures of damage corresponding to damage for each of the first set of virtual representations of the at least portions of the used cutting elements; determining a second set of measures of damage corresponding to damage for each of the second set of virtual representations of the at least portions of the used cutting elements; and identifying a more-difficult-to-drill formation from the first and second earth formations according to the first and second sets of measures of damage by statistically analyzing the first and second sets of measures of damage.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may result in embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of evaluating a set of cutting elements for an earth-boring tool, comprising:

having a borehole drilled by a mixed-cutter earth-boring tool comprising a first set of cutting elements and a second set of cutting elements secured to the mixed-cutter earth-boring tool to produce a first set of used cutting elements and a second set of used cutting elements, wherein at least one region of the mixed-cutter earth-boring tool has at least one cutting element of each of the first set of cutting elements and the second set of cutting elements, and the cutting elements of the second set of cutting elements have at least one material property that is different from a material property of the cutting elements of the first set of cutting elements;

using a virtual-representation capture device selected from the group consisting of a digital camera, a scanner, an optoacoustic imaging device, and a confocal microscopy device to generate a first set of virtual representations of at least portions of the cutting elements from the first set of used cutting elements using a process selected from the group consisting of capturing reflected light waves, capturing reflected sound waves, and probing;

using the virtual-representation capture device to generate a second set of virtual representations of at least portions of the cutting elements from the second set of used cutting elements using the process selected from the group consisting of capturing reflected light waves, capturing reflected sound waves, and probing;

determining a first set of measures of damage corresponding to damage for each of the first set of virtual representations of the at least portions of the used cutting elements;

determining a second set of measures of damage corresponding to damage for each of the second set of virtual representations of the at least portions of the used cutting elements; and identifying a set of cutting elements with a smallest amount of normalized damage from the first and second sets of used cutting elements according to the first and second sets of measures of damage by statistically analyzing the first and second sets of measures of damage and normalizing the first and second sets of measures of damage relative to at least one factor selected from the group consisting of relative placement, work rate, predicted loads, actual loads, operating temperature, heat flux, position, orientation, velocity, and exposure.

2. The method of claim 1, wherein identifying the set of cutting elements with the smallest amount of normalized damage from the first and second sets of used cutting elements comprises normalizing the first and second sets of measures of damage based on work rate.

3. The method of claim 1, wherein normalizing the first and second sets of measures of damage comprises:

plotting each of the first and second sets of measures of damage on a graph having a value of the measures of damage on one axis and distance of respective used cutting elements of the first and second sets of used cutting elements from a central axis of the same earth-boring tool on another, perpendicular axis;

fitting a curve to the first and second sets of measures of damage on the graph; and subtracting a difference between each respective measure of damage of the first and second sets of measures of damage and each respective curved measure of damage of the curve at each corresponding radial distance from the central axis of the same earth-boring tool from each respective measure of damage of the first and second sets of measures of damage to obtain the normalized first and second sets of measures of damage.

4. The method of claim 1, wherein normalizing the first and second sets of measures of damage comprises:

performing a regression analysis to generate a curve fit to the first and second sets of measures of damage with respect to distance of respective used cutting elements of the first and second sets of used cutting elements from a central axis of the same earth-boring tool; and subtracting a difference between each respective measure of damage of the first and second sets of measures of damage and each respective curved measure of damage of the curve at each corresponding radial distance from the central axis of the same earth-boring tool from each respective measure of damage of the first and second sets of measures of damage to obtain the normalized first and second sets of measures of damage.

5. The method of claim 1, wherein normalizing the first and second sets of measures of damage comprises:

determining a work rate of each used cutting element of the first and second sets of used cutting elements during use;

dividing each work rate of each used cutting element of the first and second sets of used cutting elements by a greatest work rate experienced by a cutting element of the first and second sets of used cutting elements to generate a set of work rate ratios; and dividing each measure of damage of the first and second sets of measures of damage by a respective work rate ratio of the set of work rate ratios corresponding to a respective cutting element of the first and second sets of used cutting elements for each measure of damage.

6. The method of claim 1, wherein normalizing the first and second sets of measures of damage comprises:

determining a work rate of each used cutting element of the first and second sets of used cutting elements during use; and dividing each measure of damage of the first and second sets of measures of damage by a quantitative measure of damage of a respective cutting element of the first and second sets of used cutting elements having experienced a greatest work rate.

7. The method of claim 1, wherein identifying the set of cutting elements with the smallest amount of normalized damage from the first and second sets of used cutting elements comprises identifying the set of cutting elements with the smallest amount of normalized damage between a set of prototype cutting elements and a set of cutting elements of a preexisting design.

8. The method of claim 1, wherein determining the first and second sets of measures of damage corresponding to damage for each of the respective first and second sets of virtual representations of the at least portions of the cutting elements comprises quantitatively determining at least one of volume loss, spall area, spall height, spall width, spall cross-sectional area, wear scar area, wear scar height, wear scar width, size of internal flaws, and quantity of internal flaws for each of the respective first and second sets of virtual representations of the at least portions of the cutting elements.

9. The method of claim 1, wherein determining the first and second sets of measures of damage corresponding to damage for each of the first and second sets of virtual representations of the at least portions of the cutting elements comprises digitally analyzing photographs of the at least portions of the used cutting elements from the first and second sets of used cutting elements to generate first and second sets of quantitative measures of damage.

10. The method of claim 1, wherein identifying the set of cutting elements with the smallest amount of normalized damage from the first and second sets of used cutting elements according to the first and second sets of measures of damage comprises generating first and second sets of comparative performance ratios corresponding to the first and second sets of used cutting elements by dividing an average of measures of damage associated with each of two used cutting elements laterally adjacent to a respective used cutting element by a measure of damage associated with the respective used cutting element for each of the measures of damage and performing an analysis of variance on the first and second sets of comparative performance ratios.

11. The method of claim 1, wherein identifying the set of cutting elements with the smallest amount of normalized damage from the first and second sets of used cutting elements according to the first and second sets of quantitative measures of damage comprises performing an analysis of variance on the first and second sets of quantitative measures of damage.

12. The method of claim 1, wherein generating the first and second sets of virtual representations of the at least portions of the cutting elements from the first and second sets of used cutting elements comprises scanning the at least a portion of each cutting element of the first and second sets of used cutting elements utilizing at least one of a scanner, a confocal scanning acoustic microscope, an optoacoustic imaging device, a three-dimensional measuring macroscope, and a confocal microscopy device.

13. The method of claim 1, further comprising marking each cutting element of the first and second sets of cutting elements with a respective identifying mark before using each cutting element of the first and second sets of cutting elements.

14. A computer-implemented method of determining whether a prototype cutting element for an earth-boring tool performs better than a cutting element of a preexisting design for the earth-boring tool, comprising:
  receiving at a non-transitory memory of a computing device a first set of virtual representations of at least damaged portions of cutting elements from a set of used prototype cutting elements;
  receiving at the non-transitory memory of the computing device a second set of virtual representations of at least damaged portions of cutting elements from a set of used cutting elements of a preexisting design, the set of used prototype cutting elements and the set of used cutting elements of the preexisting design having been used in a same region at a same time on a same earth-boring tool;
  using a virtual-representation capture device selected from the group consisting of a digital camera, a scanner, an optoacoustic imaging device, and a confocal microscopy device to generate, at a processing unit of the computing device, a first set of quantitative measures of damage corresponding to damage for each of the first set of virtual representations of the at least damaged portions of the cutting elements using a process selected from the group consisting of capturing reflected light waves, capturing reflected sound waves, and probing;
  using a virtual-representation capture device to generate at the processing unit of the computing device a second set of quantitative measures of damage corresponding to damage for each of the second set of virtual representations of the at least damaged portions of the cutting elements using a process selected from the group consisting of capturing reflected light waves, capturing reflected sound waves, and probing;
  normalizing at the processing unit of the computing device the first and second sets of quantitative measures of damage relative to at least one of placement, damage, and work rate; and
  determining at the processing unit of the computing device whether the set of used prototype cutting elements outperformed the set of used cutting elements of the preexisting design according to the normalized first and second sets of quantitative measures of damage by performing an analysis of variance on the normalized first and second sets of quantitative measures of damage by statistically analyzing the normalized first and second sets of measures of damage.

15. The method of claim 14, wherein generating the first and second sets of quantitative measures of damage corresponding to damage for each of the respective first and second sets of virtual representations of the at least damaged portions of the cutting elements comprises determining at least one of volume loss, spall area, spall height, spall width, spall cross-sectional area, wear scar area, wear scar height, wear scar width, quantity of internal flaws, and size of internal flaws for each of the respective first and second sets of virtual representations of the at least damaged portions of the cutting elements.

16. The method of claim 14, wherein normalizing the first and second sets of quantitative measures of damage comprises:
  determining a work rate of each used cutting element of the set of used prototype cutting elements and the set of used cutting elements of the preexisting design during use;
  dividing each work rate of each used cutting element of the set of used prototype cutting elements and the set of used cutting elements of the preexisting design by a greatest work rate experienced by a cutting element of the set of used prototype cutting elements and the set of used cutting elements of the preexisting design to generate a set of work rate ratios; and
  dividing each quantitative measure of damage of the first and second sets of quantitative measures of damage by a respective work rate ratio of the set of work rate ratios corresponding to a respective cutting element of the set of used prototype cutting elements and the set of used cutting elements of the preexisting design for each quantitative measure of damage.

17. The method of claim 14, wherein determining whether the set of used prototype cutting elements outperformed the set of used cutting elements of the preexisting design comprises generating first and second sets of comparative performance ratios corresponding to the set of used prototype cutting elements and the set of used cutting elements of the preexisting design by dividing an average of normalized quantitative measures of damage associated with each of two used cutting elements laterally adjacent to a respective used cutting element by a normalized quantitative measure of damage associated with the respective used cutting element for each of the normalized quantitative measures of damage and performing an analysis of variance on the first and second sets of comparative performance ratios.

18. The method of claim 14, wherein receiving the first and second sets of quantitative measures of damage comprises digitally analyzing photographs of the at least damaged portions of the used cutting elements from the set of used prototype cutting elements and the set of used cutting elements of the preexisting design.

19. The method of claim 14, wherein receiving the first and second sets of virtual representations of the at least damaged portions of the cutting elements from the set of used prototype cutting elements and the set of used cutting elements of the preexisting design comprises scanning the at least damaged portions of each cutting element of the set of used prototype cutting elements and the set of used cutting elements of the preexisting design utilizing at least one of a microscope scanner, a confocal scanning acoustic microscope, a three-dimensional measuring macroscope, an optoacoustic imaging device, and a confocal microscopy device.

20. The method of claim 14, further comprising marking each cutting element of the set of prototype cutting elements and the set of cutting elements of the preexisting design with a respective identifying mark before using each cutting element of the set of prototype cutting elements and the set of cutting elements of the preexisting design.

* * * * *